United States Patent [19]
von Helmolt et al.

[11] Patent Number: 6,008,931
[45] Date of Patent: Dec. 28, 1999

[54] OPTICAL FREQUENCY GENERATOR

[75] Inventors: Clemens von Helmolt; Udo Krueger, both of Berlin, Germany

[73] Assignee: Heinrich Hertz Institut Fuer nachrichtentechnik Berlin GmbH, Berlin, Germany

[21] Appl. No.: 08/945,135

[22] PCT Filed: Apr. 18, 1996

[86] PCT No.: PCT/DE96/00725

§ 371 Date: Oct. 20, 1997

§ 102(e) Date: Oct. 20, 1997

[87] PCT Pub. No.: WO96/33535

PCT Pub. Date: Oct. 24, 1996

[30] Foreign Application Priority Data

Apr. 19, 1995 [DE] Germany .......................... 195 14 386

[51] Int. Cl.$^6$ .................................................. G02F 1/35
[52] U.S. Cl. ................................................................ 359/326
[58] Field of Search ................................. 359/326–332

[56] References Cited

U.S. PATENT DOCUMENTS

| 5,070,260 | 12/1991 | Wong | 359/330 |
|---|---|---|---|
| 5,177,633 | 1/1993 | Wong | 359/330 |
| 5,233,462 | 8/1993 | Wong | 359/330 |
| 5,734,493 | 3/1998 | Jopson | 359/326 |

FOREIGN PATENT DOCUMENTS

WO 93 00740  1/1993  WIPO.

OTHER PUBLICATIONS

IEEE Journal of Quantum Electronics vol. 29, No.10, Oct. 1, 1993, pp. 2693–2701.
Optics Letters, Oct. 1988, USA, vol. 13, No. 10, ISSN 0146–9592; pp. 901–903.
IEEE Photonics TechnologyLetters, vol. 6, No. 3, Mar. 1, 1994, pp. 365–368.
IEEE Photonic TechnologyLetters, vol. 5, No. 6, Jun. 1, 1993, pp. 721–725.

*Primary Examiner*—John D. Lee
*Attorney, Agent, or Firm*—Karl Hormann

[57] ABSTRACT

An optical frequency generator provided with an optical comb generator for generating a plurality of frequencies including a central frequency and side bands spaced by a frequency transmitter. The central frequency is adjustably combined with the spectral component of a reference light source. Modification of frequency differences between the central frequency and the reference light source and modification of the transmission frequency of the frequency transmitter displaces the frequency comb of the comb generator or alters its spectral width. A heterodyne receiver connected to the output of the comb generator and a test light source of unknown frequency is provided for determining the frequency of the latter.

16 Claims, 12 Drawing Sheets

OPTICAL FREQUENCY GENERATOR

BACKGROUND OF THE INVENTION

1. Field of the Invention

The invention relates to an optical frequency generator including a reference light source, a frequency transmitter, an optical comb generator for generating a plurality of optical frequencies, and electronic controls.

2. The State of the Art

An optical frequency generator of this kind is known from U.S. Pat. No. 5,233,462. In the known optical frequency generator, the light output of a laser functioning as an intensive monochromatic reference light source is fed to an optical comb generator provided with a plurality of optical parametric oscillators. The optical parametric oscillators arrayed in parallel are tuned relative to each other such that the so-called signal and idler beams of individual ones of the optical parametric oscillators form a coarse frequency comb with large frequency spacings. One of the two output beams, e.g. the signal beam, of each optical parametric oscillator is fed to an associated electro-optical modulator of the comb generator, the modulator being fed with a frequency from a microwave transmitter acting as a frequency transmitter and capable of generating a plurality of side bands to the center frequency of the input signal beam, the frequency spacing of the side bands corresponding to the supplied microwave frequency.

While, because of the optical parametric process at a constant frequency of the reference light source, the tuning range of the known optical frequency generator is relatively wide, it is extremely complex in terms of equipment, owing to the requisite number of optical parametric oscillators, electro-optical modulators as well as the requirement for precise control of the frequency division ratio of each optical parametric oscillator. Furthermore, to operate the optical parametric oscillators, a highly intensive reference light source is mandatory. Moreover, before the unknown frequency of an light source can be determined it is necessary to take advance measurements with a wavelength meter.

In one application, the known frequency generator is used as an optical frequency measuring device. In this context, it is possible to measure the unknown frequency of the frequency component of the test light, provided the frequency of the frequency component of the reference light source, the division ratio of the optical parametric oscillators and the frequency of the microwaves fed to the electro-optical modulators are known exactly. To this end, the beat signal or frequency between the unknown frequency and the next adjacent sideband of an optical parametric oscillator are measured following a relatively coarse measurement of the wavelength of the test light. The exact position of the sideband and, with it, the absolute frequency may be determined by varying the frequency of the microwaves fed to the electro-optical modulators and by measuring any change in the beat frequency correlated to the order of the sideband.

OBJECT OF THE INVENTION

It is a task of the invention to provide an optical frequency generator of the kind referred to supra which makes it possible to generate a frequency comb with precisely determinable frequency lines with relatively simple equipment.

BRIEF SUMMARY OF THE INVENTION

In accordance with the invention, the task is accomplished by a is comb generator is provided with a light source which may be frequency modulated by an output signal of a frequency transmitter adjustable in its frequency by an electronic control circuit and by an optically non-linear component acted upon by the light source whereby a plurality of sidebands may be generated with frequency spacings corresponding to a multiple of the frequency of the input signal output by the frequency transmitter and by the fact that the light output of the comb generator may be superposed by the light output of the reference light source in a superheterodyne unit to generate a control signal.

By superheterodyning the light output of the comb generator with the very narrow-banded light output of a reference light source which for reasons of expediency is of low intensity, the frequencies of the individual sidebands of the frequency comb may be precisely determined, and the center frequency of the comb generator may be electronically precisely set by the control signal. The frequency spacing between the sidebands may be set by the transmitting frequency of the frequency transmitter so that the width of the comb may be selectively altered electronically. In this manner, the position and the width of the frequency comb may be electronically precisely adjusted by coupling frequency signals, for instance in the range of radio frequencies or microwaves, with the very narrow-banded reference light source of known frequency without the necessity of any elaborate optical adjustment or optical wavelength measuring.

In an advantageous embodiment of the optical frequency generator, the comb generator is provided with a semiconductor laser the control current of which as the superheterodyning unit is on the one hand controlled in its mean value by a center frequency control and which on the other hand is modulated in its means value by a microwave frequency from the frequency transmitter. For that reason, the light output of the semiconductor laser has a few sidebands about the center frequency, whereby the spectrum width of the semiconductor laser in dependence of the sidebands generated corresponds to about ten to a hundred times the input microwave frequency.

The light output of the semiconductor laser is fed to a supercontinuum generator having a fiber amplifier and a light guide fiber, by means of which the output signal of the semiconductor laser may by optically non-linear effects typically be increased as a comb spectrum by a factor of about 200 whereby owing to the passively acting supercontinuum generator the frequency spacings between the sidebands correspond to the microwave frequency fed to the semiconductor laser, whereas the position of the frequency comb is defined by the center frequency of the semiconductor laser which is adjustable by the center frequency control.

In a variation of the advantageous embodiment mentioned supra, there is no center frequency control. Instead, the center frequency of the semiconductor laser may be adjusted directly, and the absolute position of a sideband of the optical comb generator is defined by several measurements of the displacement frequency between the light output of the reference light source and a further sideband of the comb generator. In this manner, complex apparatus may be avoided at high input frequencies of the center frequency control.

BRIEF DESCRIPTION OF THE SEVERAL DRAWINGS

Further advantages and expedient embodiments of the invention are set forth in the subclaims and in the ensuing description of embodiments exemplarily shown in the drawings, in which FIG. 1 is a block diagram of an embodiment of an optical frequency generator as used for measuring unknown light frequencies;

DETAILED DESCRIPTION OF PREFERRED EMBODIMENTS

Figure 1:
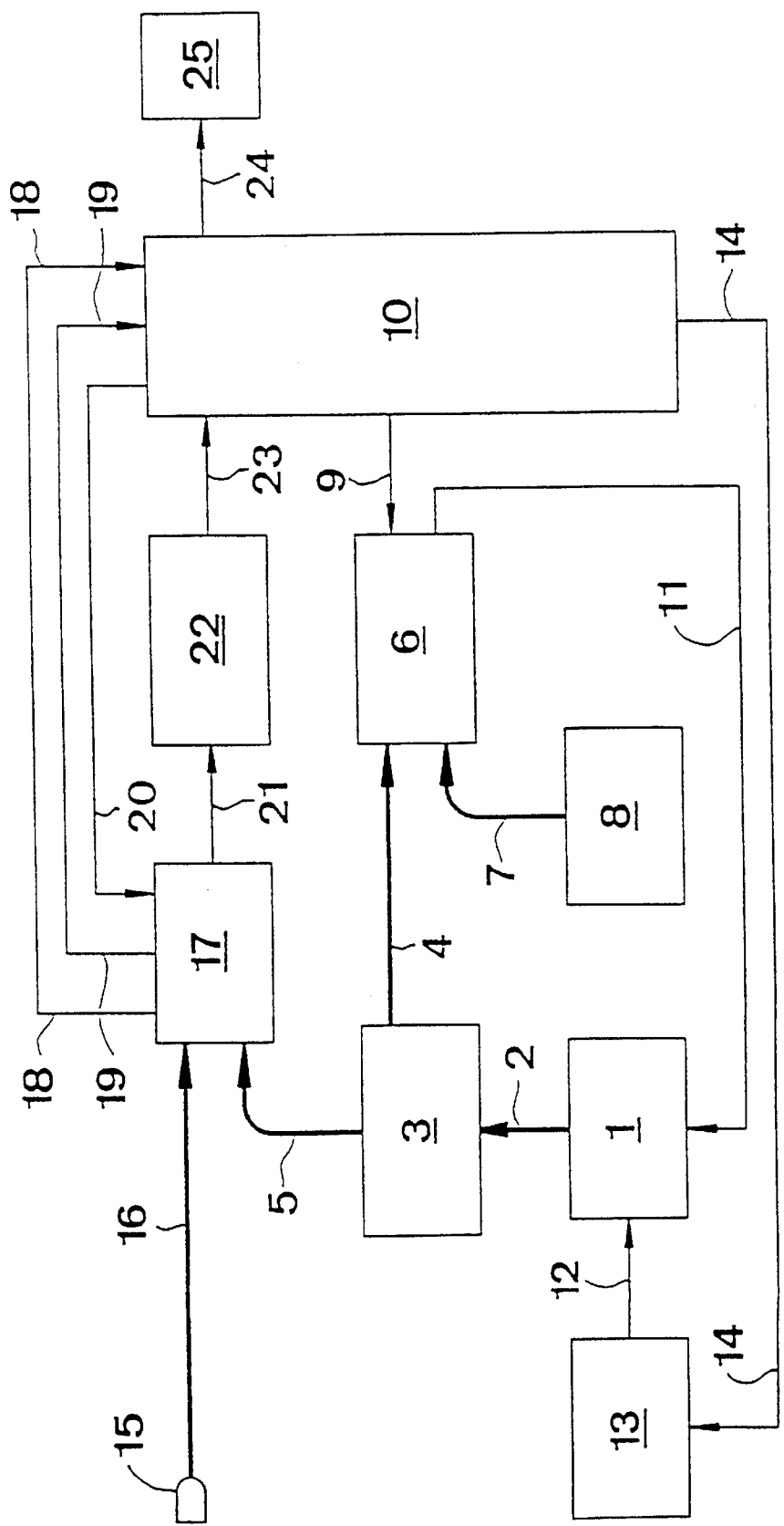

FIG. 1 is a block diagram of an embodiment of an optical frequency generator used for determining unknown optical frequencies. The optical frequency generator is provided with a comb generator 1, a preferred embodiment of which is described with reference to greater detail in FIG. 2, for generating a plurality of sidebands around a center frequency. By means of a comb light guide 2, the light output of the comb generator 1 is fed to a beam splitter 3 by which the light output of the comb generator 1 may be divided into a first partial comb light guide 4 and a second partial comb light guide 5.

The light output of the comb generator 1 conducted in the first partial comb light guide 4 may be fed to a center frequency control 6 described in more detail with reference to FIG. 3 and functioning as a superheterodyne unit, together with light output of a stabilized reference light source 8 of a very narrow reference line, conducted in a reference light guide 7. Furthermore, a difference control signal generated by an electronic control 10 may be fed to the center frequency control 6 by way of a difference control conduit 9, the difference control signal corresponding to a difference, to be maintained by the center frequency control 6, between the reference line of the reference light source 8 and a frequency component of the light output of the comb generator 1. A control signal generated by the center frequency control 6 may be fed back to the comb generator 1 by a control conduit 11 for adjusting the center frequency.

Furthermore, the output signal of a microwave transmitter 13 functioning as a frequency transmitter may be fed to the comb generator 1 by way of a microwave conduit 12 with which the frequency spacing between adjacent sidebands in the light output of the comb generator 1 may be adjusted. The transmission frequency of the microwave transmitter 13 may be set by the electronic control 10 by way of a microwave control conduit 14.

In the embodiment of an optical frequency generator shown in FIG. 1, the light output of the comb generator 1 conducted in the second partial comb light guide 5 may be superheterodyned with test light of unknown frequency conducted in an input light guide 16 and coupled into it from an input coupler 15, in a superheterodyne receiver 17 one embodiment of which will be described in connection with greater detail in FIG. 4. Controlled by a first load conduit 18, a second load conduit 19 and a switch conduit 20 between the superheterodyne receiver 17 and the electronic control 10, a beat frequency signal corresponding to the frequency difference between a frequency component of the light output of the comb generator 1 and the test light may be fed to a frequency counter 22. A value of the beat frequency defined by the frequency counter 22 may be fed back to the electronic control 10 by a signal conduit 23.

A frequency value of the test light to be determined by a process to be explained in more detail infra may be fed by way of a display conduit 24 from the electronic control 10 to a frequency indicator device 25 by which the frequency of the test light may be indicated.

Figure 2:
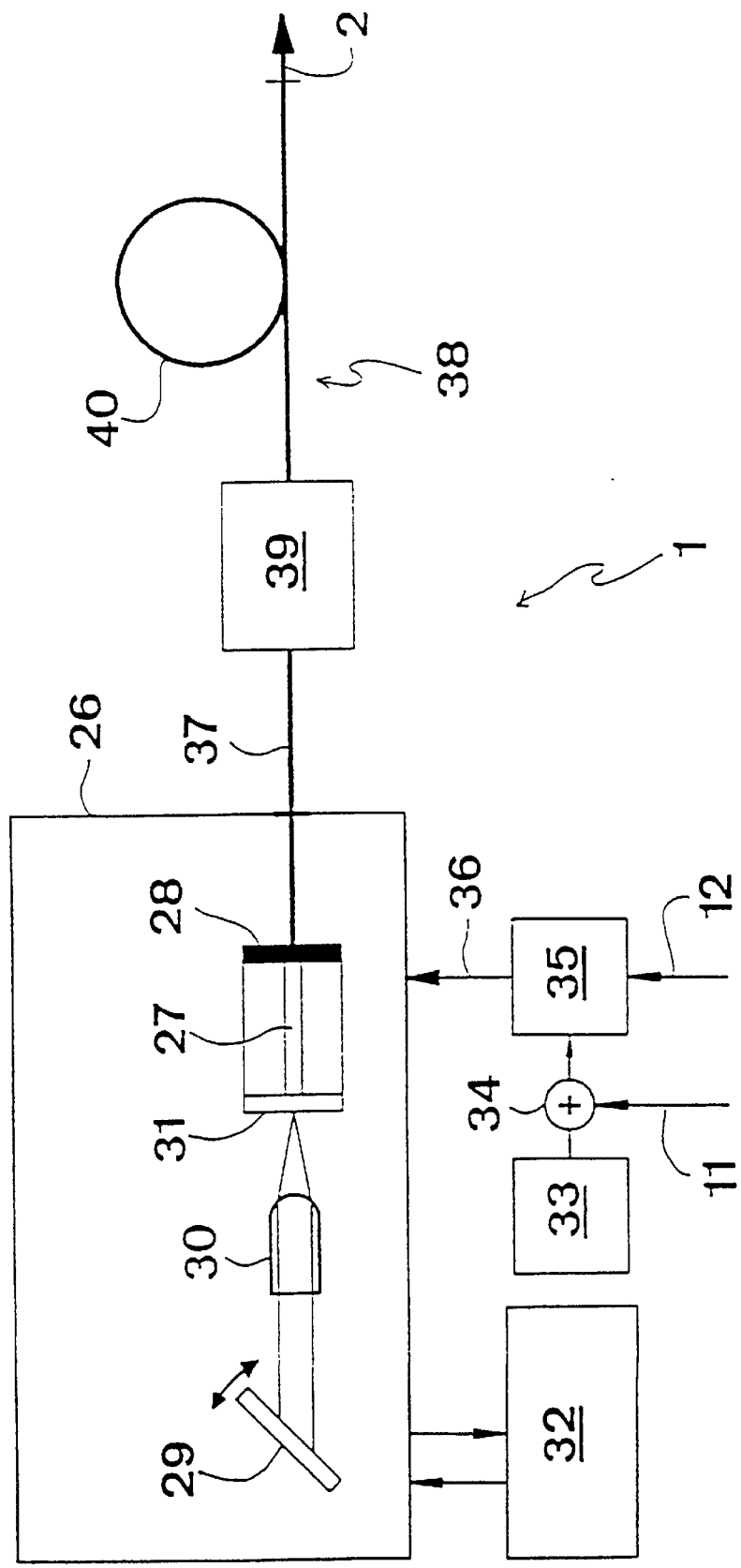
FIG. 2 depicts an embodiment of a comb generator of the optical frequency generator of FIG. 1.

FIG. 2 depicts an expedient embodiment of a comb generator 1 of the kind with which the optical frequency generator of FIG. 1 is provided. The comb generator of FIG. 2 is provided with a semiconductor laser 26 the active medium 27 of which is arranged between a coupling aperture 28 functioning as an absorber which may be saturated for generating, by mode coupling, pulses of very high peak power, and a reflection grating 29. For setting of the wavelength, the reflection grating 29 may be tilted relative to the beam axis of the resonator by an adjustment device not shown in FIG. 2.

The coupling aperture 28 and the reflection grating 29 constitute an external resonator of the semiconductor laser 26, in the beam path of which there are also provided an expansion optic 30 for large surface illumination of the reflection grating 29 as well as an antireflection-coated exit aperture 31 connected with the active medium, on the interior of the resonator.

The temperature of the semiconductor laser 29 is stabilized by a temperature control 32, the operating temperature of the semiconductor laser 26 being adjustable by the temperature control 32 for tuning the wavelength of the laser, for instance.

For energizing the semiconductor laser 26, there is provided a direct current source 33 the output current of which is fed to one input of an adder stage 34. The control conduit 11 connected to the center frequency control 6 is connected to the second input of the adder stage 34. The amperage of the direct current supplied by the D.C. source 33 may be changed by the control signal in the control conduit 11.

The output current of the adder stage 34 is fed to a laser control circuit 35 as is the output signal of the microwave transmitter 13 by the microwave conduit 12. The control current which may be fed to the semiconductor laser 26 from the laser control circuit 35 by a laser control conduit 36 is modulated with the transmission frequency of the microwave transmitter 13 so that the light output of the semiconductor laser 26 conducted in the laser light guide 37 in addition to the center frequency contains sidebands of a frequency spacing corresponding to the transmission frequency of the microwave transmitter 13.

The light output of the semiconductor laser 26 conducted in the laser light guide 37 is fed to a supercontinuum generator 38 provided with an erbium-doped fiber amplifier 39 as well as a supercontinuum fiber 40 having a length from several meters to several kilometers. The supercontinuum fiber 40 has a minimum dispersion in the range of the center frequency of the semiconductor laser 26. Because of nonlinear effects such as auto phase modulation, cross phase modulation and four-wave-mixing occurring at a high light energy density in a light guide, the spectrum of the light output of the semiconductor laser 26 conducted in the laser light guide may be expanded by means of the supercontinuum generator 38 by a factor of from, for instance, approximately 100 gigahertz to at least about 25 terahertz. The light output of the supercontinuum generator 38 is conducted in the comb light guide 2.

Figure 3:
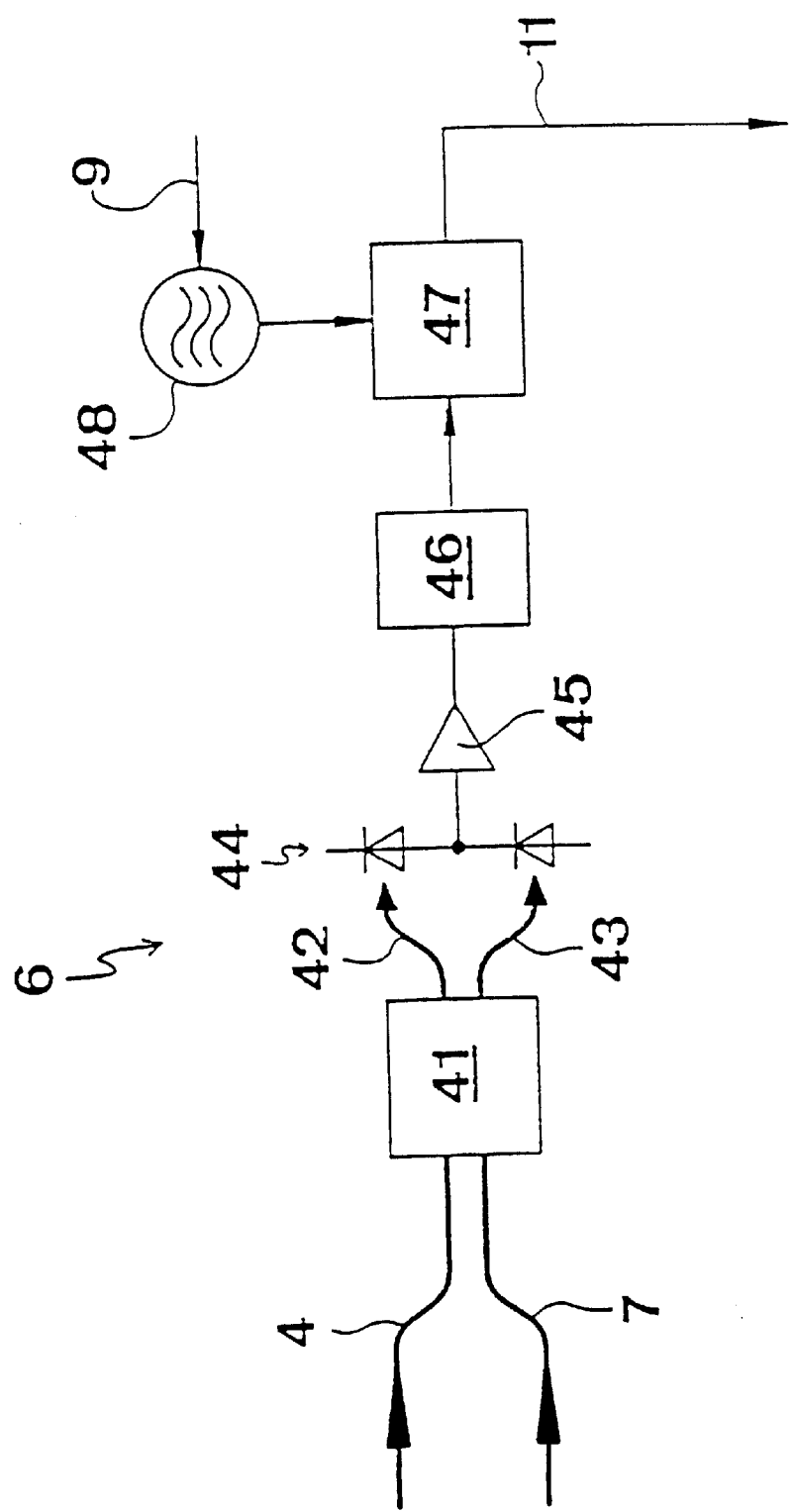
FIG. 3 depicts an embodiment of a center frequency control used as a superheterodyne unit of the optical frequency generator of FIG. 1.

FIG. 3 depicts an expedient embodiment of the center frequency control 6 of the optical frequency generator of FIG. 1. The light output of the comb generator 1 conducted in the first partial comb light guide 4 may be superheterodyned by means of a control light superhetrodyne device 41 such as, for instance, a 3 dB-X-switch with the light output of the reference light source 8 conducted in the reference light guide 7 and divisible in equal shares to a first control light guide 42 and a second control light guide 43. The light output of the control light guides 42, 43 is fed to one each of two photo-diodes connected in series as well as blocking directions functioning as mixing elements of a light-sensitive regulating detector 44 the band width of which is in the order of several 10 gigahertz. The output signal of the regulating detector 44 taken from the junction of the two photo-diodes is fed through a control preamplifier 45 to a regulating intermediate frequency low pass filter 46 the upper limiting frequency of which is greater than the transmission frequency of the microwave transmitter 13.

The output signal of the regulating intermediate frequency filter 46 may be fed to a first input of a comparator circuit 47. The output signal of a difference frequency generator 48 is fed to the second input of the comparator circuit 47. The transmission frequency of the difference frequency generator 48 is adjustable between a minimum value and a maximum value by the difference control conduit 9 connected to the control unit 10, the spacing between the minimum value and the maximum value being greater than the transmission frequency of the microwave transmitter 13. The comparator circuit 47 serves to define the difference between the output signal of the regulating intermediate frequency filter 46 and the transmission frequency of the difference frequency generator 48 and to generate the control signal which may be fed to the comb generator 1 by way of the control conduit 11. The control signal serves to adjust the center frequency of the semiconductor laser 26 in case of a deviation of the output signal of the regulating intermediate frequency filter 46 from the transmission frequency of the difference frequency generator 48. Evaluating the phase, for instance, in the comparator circuit 47 ensures that the frequency of the comb line which generates the intermediate frequency by mixing with the reference frequency is higher than the reference frequency.

The light output of the optical frequency generator of FIG. 1 which may be produced with the comb generator 1 thus has a comb-like line spectrum around a center frequency, extending over a spectrum range totaling about 25 terahertz. The spacing between adjacent sidebands corresponds to the transmission frequency of the microwave transmitter 13. By changing the transmission frequency of the microwave transmitter 13, at a constant center frequency the width of the frequency comb which results from multiplying the number of spectral lines by the transmission frequency, may be adjusted. The position of all spectral lines of the frequency comb may be displaced in the same direction by the change induced in the center frequency by the difference in frequency between a spectral line in the light output of the comb generator 1 and a defined stable and narrow-band spectral line in the light output of the reference light source 8, which may be adjusted by way of the difference control conduit 9 as well as the difference frequency generator 48 and fed to the comparator circuit 47.

Figure 4:
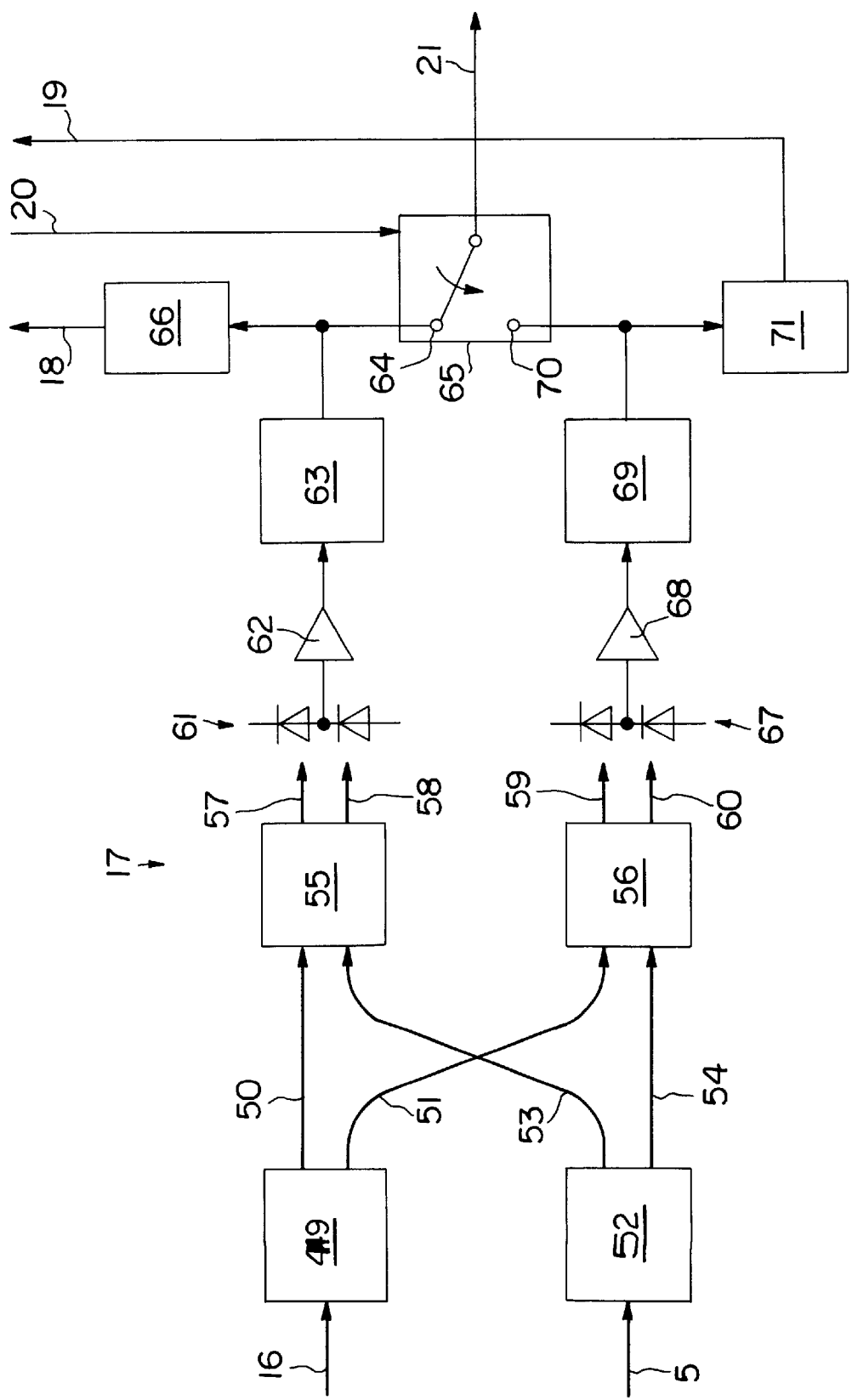
FIG. 4 is an expedient embodiment of a superheterodyne receiver for measuring unknown frequencies by means of the frequency generator of FIG. 1.

FIG. 4 depicts an expedient embodiment of a superheterodyne receiver 17. As shown in FIG. 1, test light of unknown frequency and the light output of the comb generator 1 are respectively fed into the receiver 17 by way of the input light guide 16 and the second partial comb light guide 5. The test light conducted in the input light guide 16 is fed into a first mode splitter 49 for instance for separating the transverse electric (TE) mode from the transverse magnetic (TM) mode and feeding them into a first test light mode guide 50 and second test light mode guide 51, respectively.

The light output of the comb generator 1 conducted in the second partial comb light guide 5 is fed to a second mode splitter 52 by means of which the TE mode and TM mode are separated into a first comb light mode guide 53 and a second comb light mode guide 54. The mode guides 50, 53 conducting identical modes are connected to a first beat superheterodyner 55. The mode guides 51, 54 conducting the other mode are connected to a second beat superheterodyner 56. The associated modes from the second partial comb light guide 5 and the input light guide 16 may be combined by beat superheterodyners 55, 56 structured as 3 dB-X-switches and may be separated in equal proportions into first beat light guides 57, 58 connected to the first beat superheterodyner 55 and into second beat light guides 59, 60 connected to the second beat superheterodyner 56.

The light output of beat light guides 57, 58 connected to the first beat superheterodyner 55 energizes a light-sensitive first beat light detector 61 which may consist, for instance, of two reverse coupled series connected photo-diodes. The output signal of the first beat light detector 61 derived at the junction of the two photo-diodes, for instance, may be fed by way of a first beat preamplifier 62 to a first beat intermediate frequency filter 63. The first beat intermediate frequency filter 63 may be structured as a low pass filter the upper frequency limit of which is smaller than half the transmission frequency of the microwave transmitter 13. The output signal of the first beat intermediate frequency filter 63 is fed to a first switch contact 64 of a two-way switch 65 as well as to a first output meter 66. The first output meter 66 serves to determine the amplitude of the output signal of the first beat intermediate frequency filter 63 and to feed it to the electronic control 10 by way of the output conduit 18.

The light output of the beat light guides 59, 60 connected to the second beat superheterodyner 56 is similarly fed to a light-sensitive second beat light detector 67 the output signal of which may be fed to a second beat intermediate frequency filter 69 by way of a second beat preamplifier 68. The output signal of the second beat intermediate frequency filter 69 is fed to a second switch contact 70 of the two-way switch 65 as well as to a second output meter 71 for measuring the amplitude of the output signal of the second beat intermediate frequency filter 69. The output signal of the second output meter 71 may be fed to the electronic control 10 by way of a second output conduit 19.

The electronic control 10 is provided with a comparator member to which the output signals of the output meters 66, 71 may be fed by way of the output conduits 18, 19, and by the output signal of which the two-way switch 65, over the switch conduit 20, may be put into a condition in which the beat signal conduit 21 is connected to the more intensive one of the output signals of the beat intermediate frequency filters 63, 69.

Figure 5:
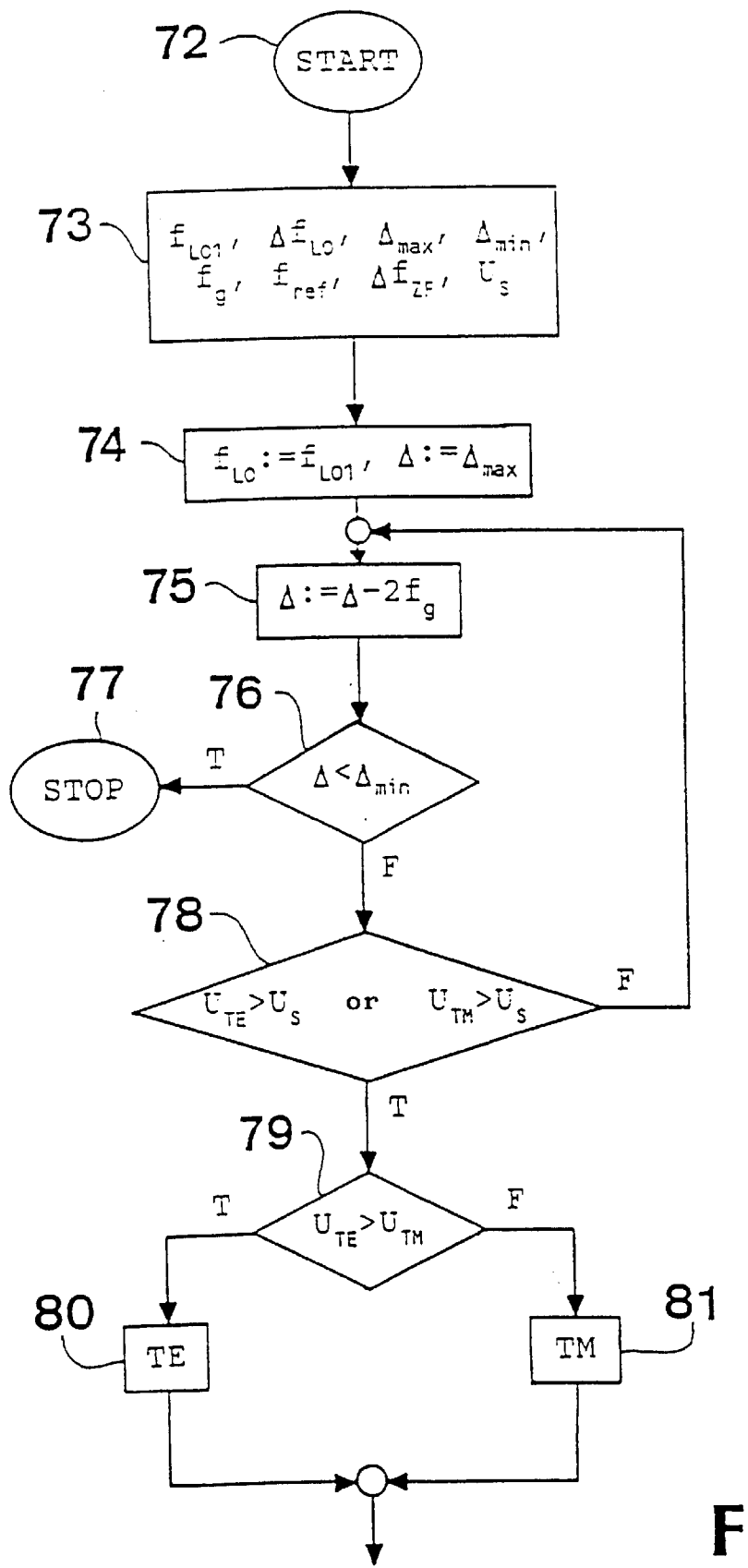
FIGS. 5, 6 depict a flow diagram of the algorithm for carrying out a frequency measurement with the optical frequency generator of FIG. 1.
Figure 6:
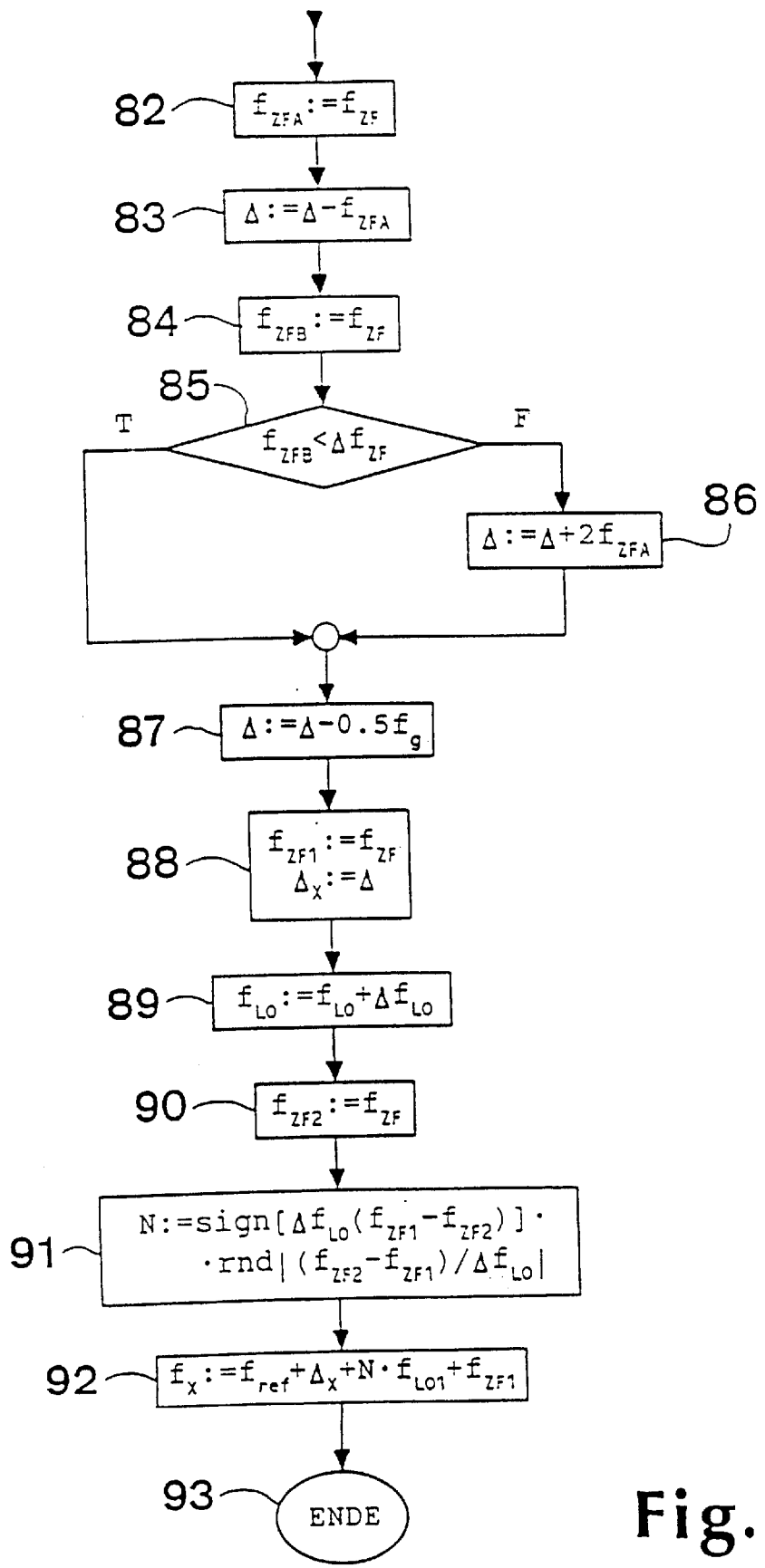

FIGS. 5 and 6 show an expedient sequence algorithm for conducting a frequency measurement with the optical frequency generator of FIG. 1. The run of the sequence algorithm is determined by the electronic control 10 on the basis of a control program or hard-wired logic and memory circuitry.

In accordance with FIG. 5, after release of a start signal in a start step 72 the variables required for conducting the measurement and determining the unknown test light frequency $f_x$ of the test light are stored in the electronic control 10 in a storing step 73. Among these variables are the starting frequency $f_{LO1}$ of the microwave transmitter 13, the sideband altering frequency $\Delta f_{LO}$ of the frequency comb of the comb generator 1, the maximum displacement frequency $\Delta_{max}$ as transmitting frequency of the difference frequency generator 48 relative to the known reference frequency $f_{ref}$ of the reference light source 8, the minimum displacement frequency $\Delta_{min}$ as transmission frequency of the difference frequency generator 48 relative to the reference frequency $f_{ref}$, the limit frequency $f_g$ of the beat intermediate frequency filters 63, 69 of the superheterodyne receiver 17 of FIG. 4, the centering tolerance frequency $\Delta f_{ZF}$ during tuning of a sideband of the optical frequency generator to the test light frequency $f_x$ to be determined and a minimum level $U_s$ for conducting the frequency measurement.

After inputting the above variables, the transmission frequency $f_{LO}$ of the microwave transmitter 13 may be adjusted to the starting frequency $f_{LO1}$ by means of the microwave control conduit 14 and the displacement frequency $\Delta$ between the reference frequency $f_{ref}$ and a frequency component of the light output of the comb generator 1 may be adjusted to the maximum displacement frequency $\Delta_{max}$ by means of the difference control conduit 9. Thereafter, the displacement frequency $\Delta$ is reduced by twice the value of the limit frequency $f_g$ by a frequency reduction step 75. Whether the displacement frequency $\Delta$ is smaller than the minimum displacement frequency $\Delta_{min}$ will be tested in an ensuing displacement frequency test step 76. If this condition is true the measurement will be discontinued by a stopping step 77.

If the test condition of the displacement frequency test step 76 is not met, a determination is made in a signal test step 78, whether at least either the transverse-electric (TE) signal level $U_{TE}$ of the first output meter 66 or the transverse-magnetic (TM) signal level $U_{TM}$ of the second output meter 71 which may be input by the output conduits 18, 19 of the electronic control 10, is greater than the minimum level $U_S$.

If neither the TE signal level $U_{TE}$ nor the TM signal level $U_{TM}$ exceeds the minimum level $U_S$, the measurement will be continued with the frequency reduction step 75.

If at least one of the signal levels $U_{TE}$, $U_{TM}$ is greater than the minimum level $U_S$, a determination is made in a signal level comparison test 79, whether the TE signal level $U_{TE}$ is greater than the TM signal level $U_{TM}$. If true, the output signal of the first beat intermediate frequency filter 63 is fed to the beat signal conduit 21 by closing the first switch contact 64 of the two-way switch 65 in a TE switching step 80. If the test condition is not met, the output signal of the second beat intermediate frequency filter 69 is fed to the beat signal conduit 21 by closing the second switch contact 70 in a TM switching step 81.

In accordance with FIG. 6, the intermediate frequency $f_{ZF}$ determined by the frequency counter 22 may be stored as a first intermediate frequency test variable $f_{ZFA}$ in a first intermediate frequency test step 82. Thereafter, the displacement frequency $\Delta$ is reduced by the first intermediate frequency test variable $f_{ZFA}$ in a first displacement frequency reduction step 83, and in a second intermediate frequency test step 84 the intermediate frequency $f_{ZF}$ determined by the frequency counter 22 may be stored as a second intermediate frequency test variable $f_{ZFB}$.

In the intermediate frequency test steps 82, 84 an exactness of about one tenth of the limit frequency $f_g$ of the beat intermediate frequency filters 63, 69 is sufficient, so that the determination of the intermediate frequency test variables $f_{ZFA}$, $f_{ZFB}$ may be carried out very quickly.

Following the second intermediate frequency test step 84, it will be determined in an intermediate frequency comparison step 85 if the second intermediate frequency variable $f_{ZFB}$ is smaller than the centering tolerance frequency $\Delta f_{ZF}$. If the condition is not met, the displacement frequency $\Delta$ may in a displacement frequency increasing step 86 be increased by twice the first intermediate frequency test variable $f_{ZFA}$ by way of the difference control conduit 9. The displacement frequency increasing step 86 performed if the condition of the intermediate frequency comparison step 85 is not met, ensures substantial similarity of the sideband frequency $f_N$ which generates the intermediate frequency $f_{ZF}$ and of the unknown test light frequency $f_x$.

Thereafter, the displacement frequency $\Delta$ is reduced by half the limit frequency $f_g$ of the beat intermediate frequency filter 63, 69 in a displacement frequency reduction step 87, so that the sideband frequency is in any case smaller than the test light frequency $f_x$. This is followed, in an intermediate frequency measuring step 88, by a very precise measurement of the intermediate frequency $f_{ZF}$ as a first intermediate frequency measuring value $F_{ZF1}$ and storing of the displacement frequency $\Delta$ as a comb light displacement frequency value $\Delta_x$. The intermediate frequency measuring step 88 will be carried out for a length of time sufficient for yielding the precise measurement of the test light frequency $f_x$.

Following the first intermediate frequency measuring step 88, the transmission frequency $f_{LO}$ of the microwave transmitter 13 may be adjusted in a transmission frequency altering step 89 by the sideband altering frequency $\Delta f_{LO}$ multiplied by half the total number of sidebands, with the sideband altering frequency $\Delta f_{LO}$ multiplied by half the total number of sidebands being of a value lower than the first intermediate frequency measuring value $f_{ZF1}$. In an ensuing intermediate frequency determination step 90, the intermediate frequency $f_{ZF}$ may be determined at an exactness of about one tenth of the sideband altering frequency $\Delta f_{LO}$, and stored.

Measuring of the frequency values is thus terminated. On the basis of the stored intermediate frequency values $f_{ZF1}$, $f_{ZF2}$ as well as the sideband altering frequency $\Delta f_{LO}$ the number N of sidebands will now be determined in respect of quantity and sign in a sideband determining step 91 on the basis of the following equation:

$$N := \text{sign}[\Delta f_{LO}(f_{ZF1} - f_{ZF2})] \cdot \text{rnd}|(f_{ZF2} - F_{ZF1})/\Delta f_{LO}|,$$

where "sign" means a sign function and "rnd" means rounding-off by a whole integer.

In a test light frequency calculation step 92 it is now possible, on the basis of the known reference frequency $f_{ref}$, the comb light displacement frequency value $\Delta_x$, the number of sidebands N calculated in the sideband determination step 91, the starting frequency $f_{LO1}$ of the microwave transmitter 13 as well as the first intermediate frequency measuring value $f_{ZF1}$, absolutely to determine the unknown test light frequency $f_x$ on the basis of the following expression:

$f_x = f_{ref} + N \cdot f_{LO1} + f_{ZF1}$.

After the test light frequency $f_x$ has been indicated in the frequency indicating device 25, the measurement is terminated by a terminating step 93. Hence, the frequency of the test light may be determined simply if the reference frequency $f_{ref}$, the comb light displacement frequency value $\Delta_x$, the microwave transmission frequency $f_{LO1}$, the known sideband altering frequency $\Delta f_{LO}$, as well as two measured intermediate frequency variables $f_{ZF1}$, $f_{ZF2}$ in the range of radio frequencies or microwaves are known, without requiring many control circuits for a chain of optical parametric oscillators or direct measurement of a light frequency or wavelength. The precision of the determination of the test light frequency $f_x$ is substantially given by the stability of the reference light source 8 relative to the reference signal $f_{ref}$ and typically lies within the range of a few 100 kilohertz.

Figure 7:
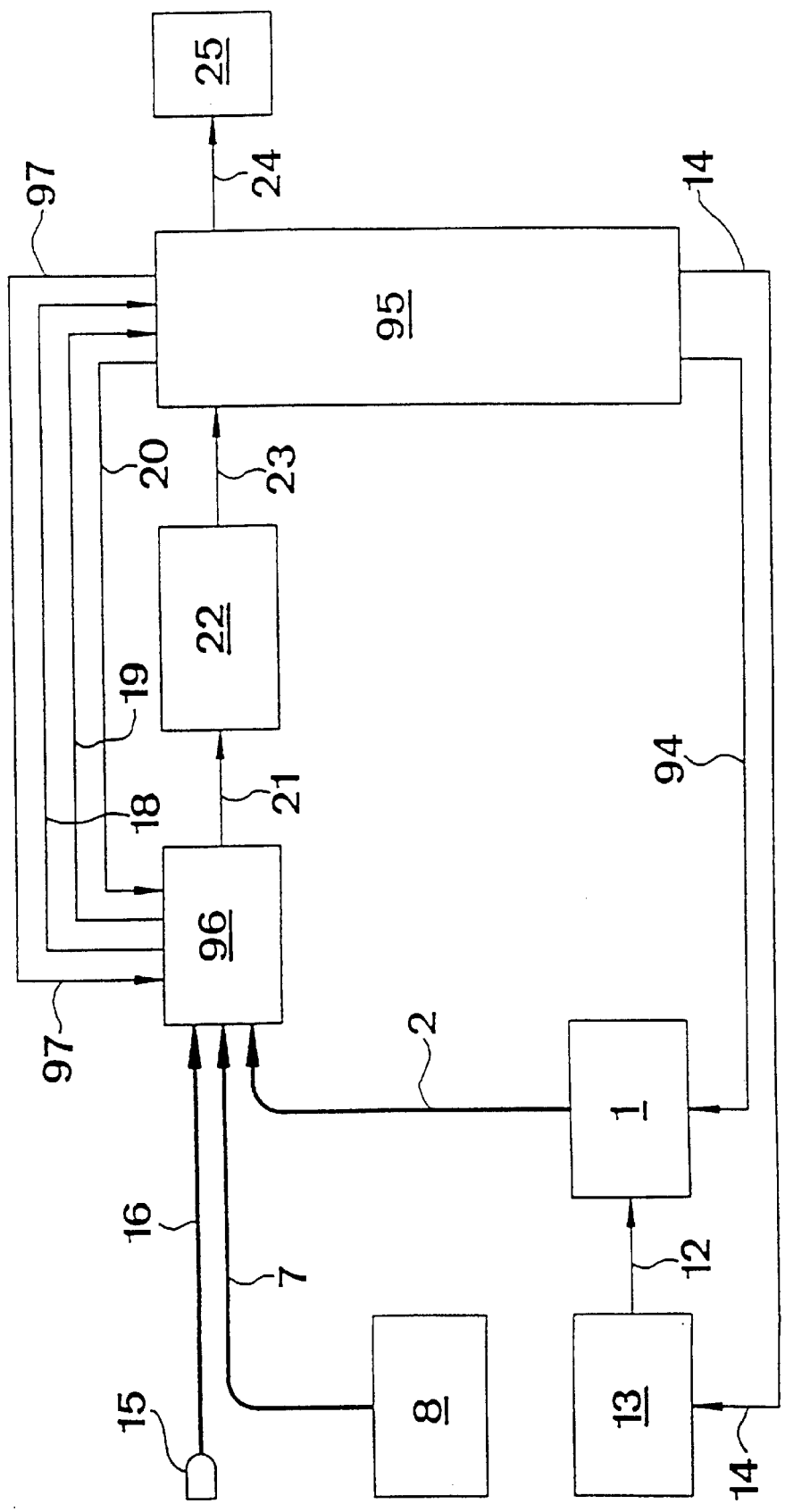
FIG. 7 is a block diagram of a further embodiment of an optical frequency generator used for measuring unknown frequencies.

FIG. 7 is a block diagram of a further embodiment of an optical frequency generator used for to measuring unknown light frequencies. Like components of the frequency generators depicted in FIG. 1 and FIG. 2 are designated by like numerals and will hereinafter not be discussed in detail.

The comb generator 1 of the optical frequency generator in accordance with FIG. 7 is directly connected to an electronic double-control 95 by means of which the center frequency of the comb generator may be adjusted directly. The light output of the comb generator conducted in the comb light guide 2, the light output of the reference light source conducted in the reference light guide 7 as well as the test light of unknown frequency conducted in the input light guide 16 by way of the input coupler 15 is fed to a double superheterodyne receiver 96 functioning as a superheterodyne unit described in more detail with reference to FIG. 8. The double superheterodyne receiver 96 may be energized by a switching signal for switching between a reference beat signal when the light output of the comb generator 1 and the light output of the reference light source 8 are combined or a reference beat signal when the light output of the comb generator 1 and the test light are combined.

Figure 8:
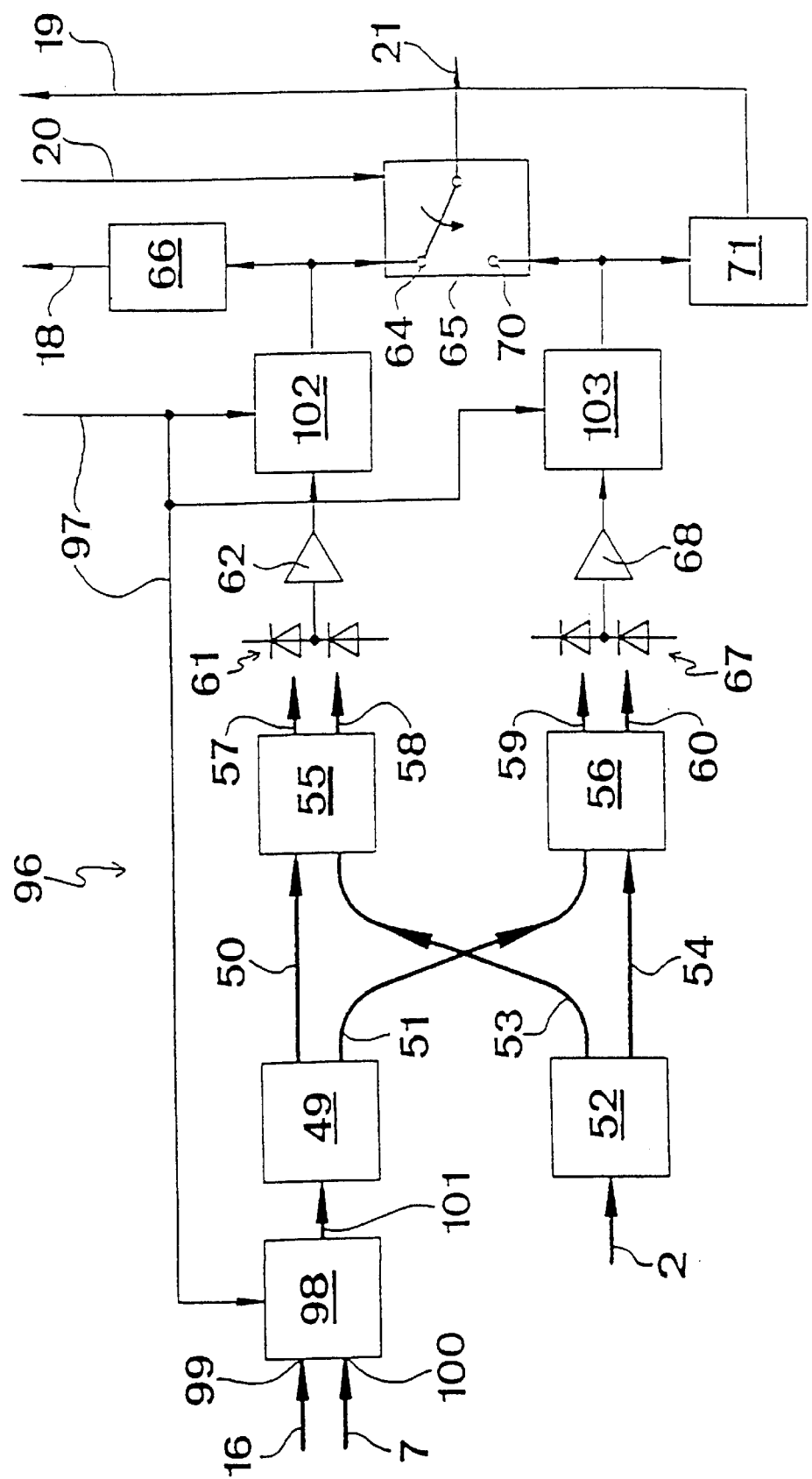
FIG. 8 is a further expedient embodiment of a superheterodyne unit for measuring unknown optical frequencies by means of the optical frequency generator of FIG. 7.

FIG. 8 is a block diagram of the double superheterodyne receiver 96 of FIG. 7., like components in FIG. 4 and FIG. 8 being designated by like reference characters and not described here in any detail. The double superheterodyne receiver 96 is provided with a light input selection switch 98, the light input conduit 16 being connected to a first input 99 thereof and the reference light conduit 7 being connected to a second input 100 thereof. Either the test light conducted in the light input conduit 16 or the light output of the reference light source 8 conducted in the reference light conduit 7 may be fed to the first mode splitter 49 via a light selection conduit 101 by means of a switch signal in the light selector switching conduit 97 connected to the light input selection switch 99. The light output of the comb generator 1 conducted in the comb light guide 2 is fed to the second mode splitter 52.

The output signals of the beat light detectors 61, 67 generated as in the superheterodyne receiver 17 of FIG. 4 are fed to a first beat intermediate frequency double filter 102 and a second beat intermediate frequency double filter 103 by way of beat preamplifiers 62, 68. The output signal of the first beat intermediate frequency double filter 102 is applied to both the first output meter 66 and the first switch contact 64 of the two-way switch 65. The output signal of the second beat intermediate frequency double filter 103 is correspondingly applied to both the second output meter 71 and the second switch contact 70 of the two-way switch 65. The beat intermediate frequency double filters 102, 103 may be energized by the switching signal of the light selector switching conduit 97.

Figure 9:
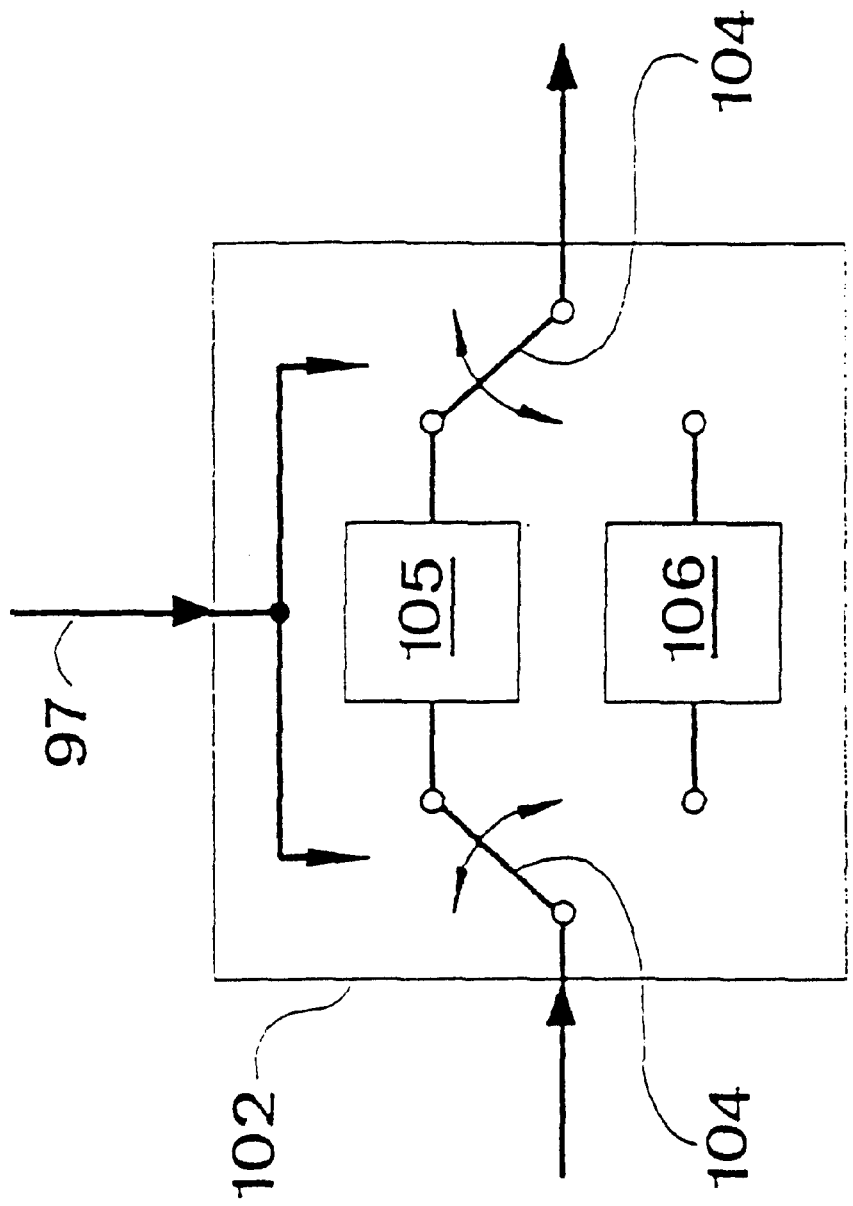
FIG. 9 depicts a switchable intermediate frequency filter of the superheterodyne unit of FIG. 8.

The structure of the first beat intermediate frequency double filter 102 is depicted in the block diagram of FIG. 9. The second beat intermediate frequency double filter 103 is structured identically. A filter selection switch 104 may be actuated by the switching signal conducted in the light selector switching conduit 97. The filter selection switch 104 activates either a test light intermediate frequency filter 105 or a reference light intermediate frequency filter 106. For practical purposes, the intermediate frequency filters 105, 106 are low pass filters, the limit frequency of the test light intermediate frequency filter 105 being lower than the limit frequency of the reference light intermediate frequency filter 106.

Figure 10:
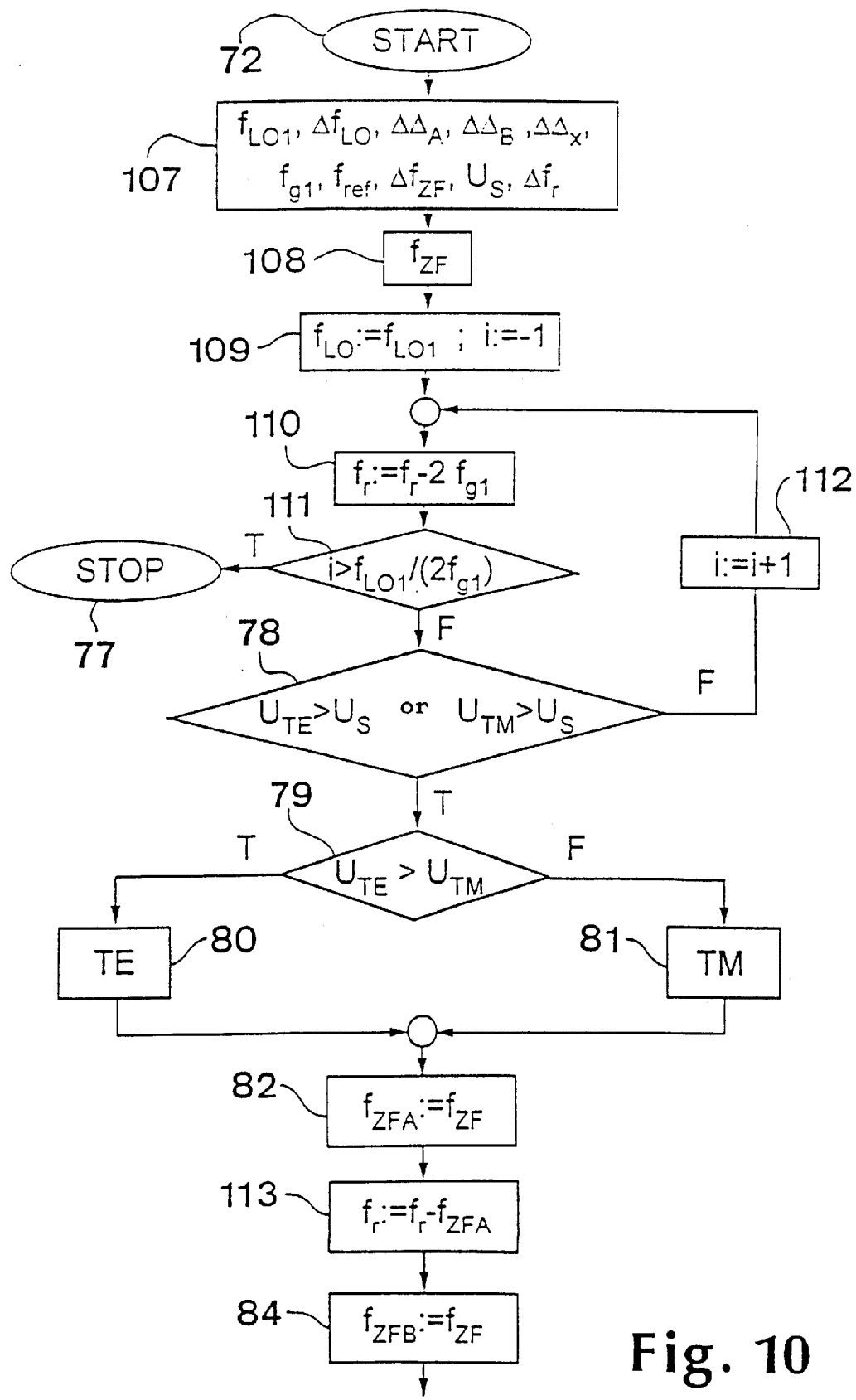
FIGS. 10, 11, 12 depict a further flow chart of an algorithm for carrying out a frequency measurement with the optical frequency generator of FIG. 7.
Figure 11:
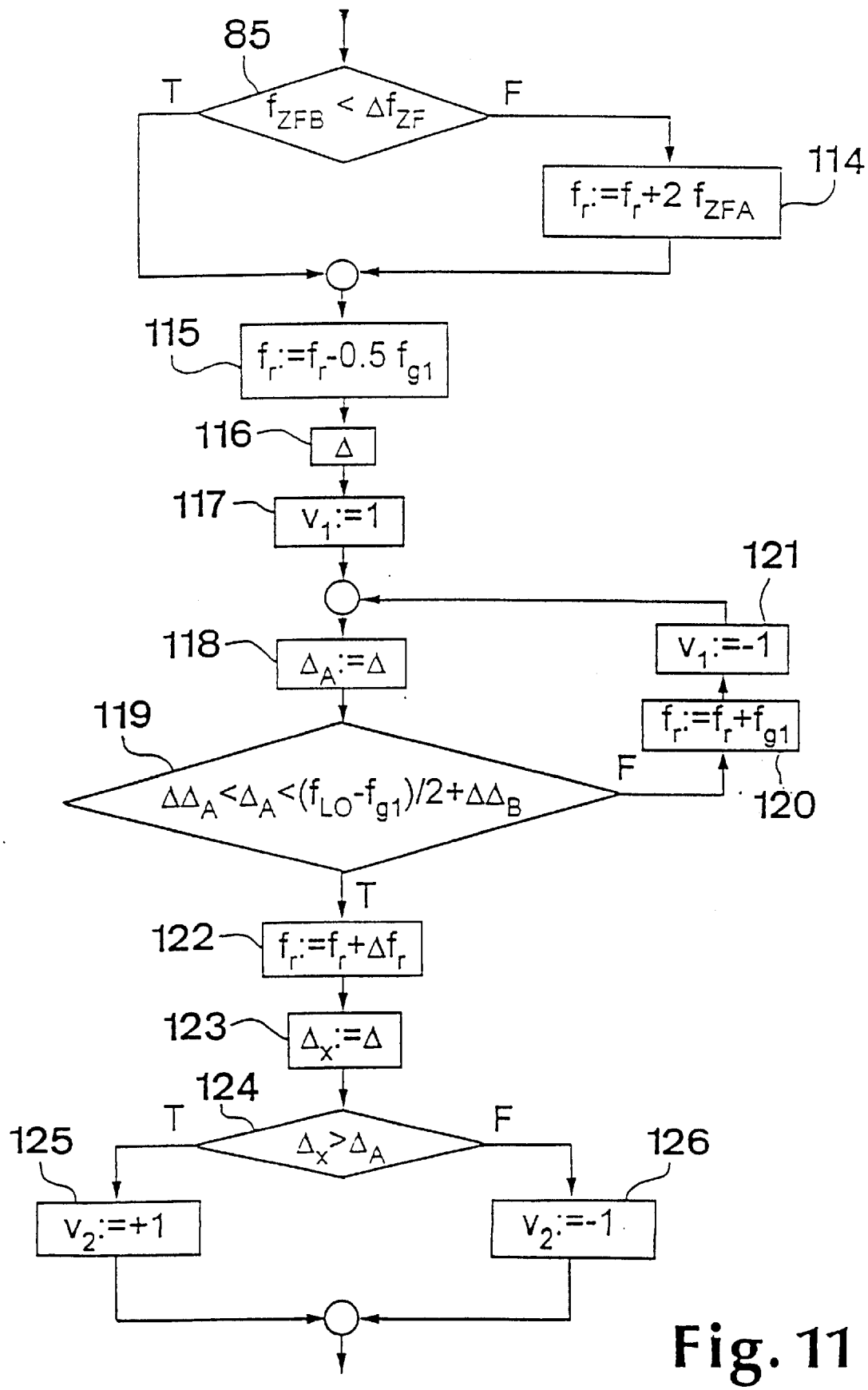
Figure 12:
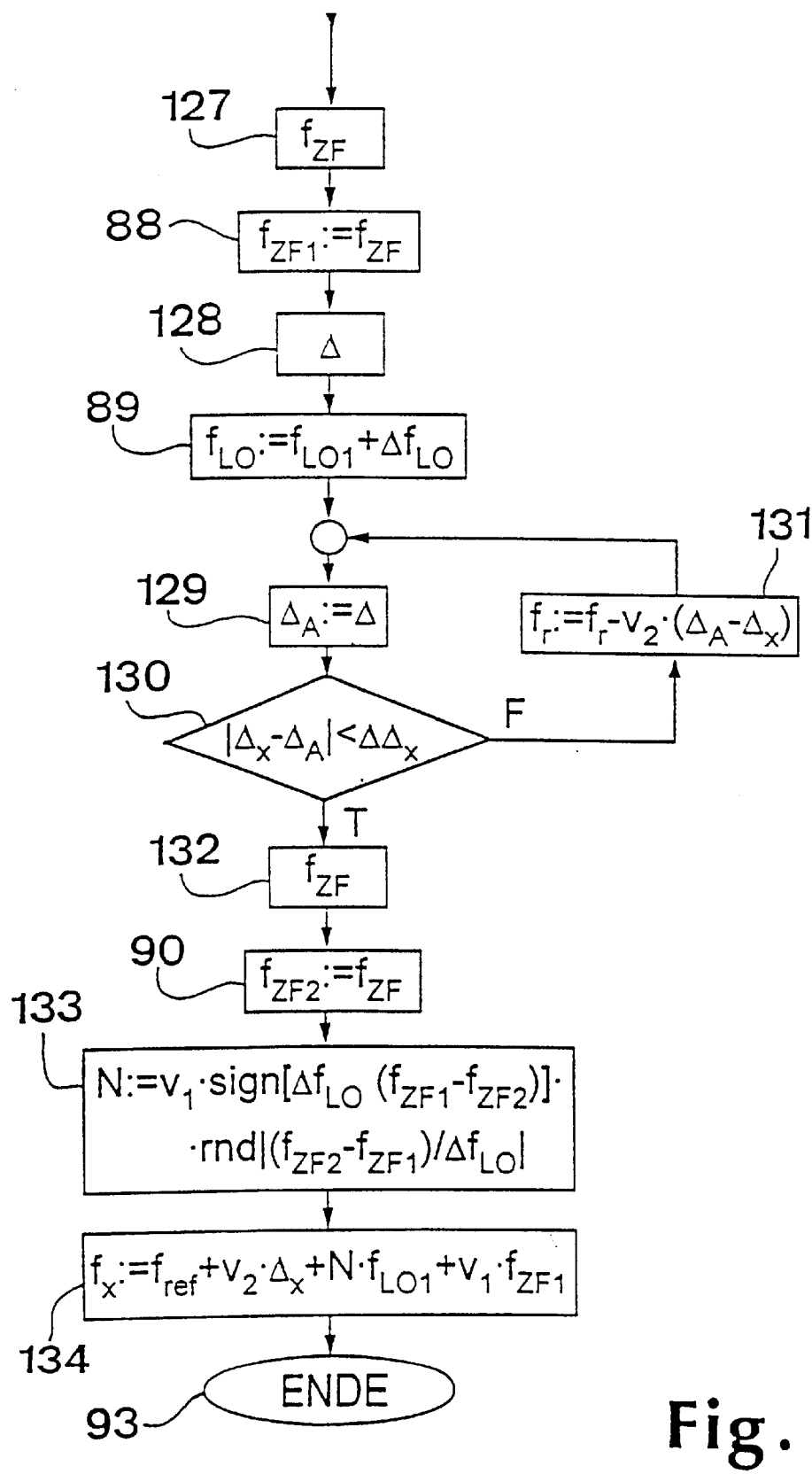

FIG. 10, FIG. 11 and FIG. 12 display a sequential algorithm modified relative to the algorithm of FIG. 5 and FIG. 6., for executing a frequency measurement with the optical frequency generator of FIG. 7. The sequencing of the algorithm is performed by the electronic double control 95 in accordance with a control program or hard-wired logic and storage circuitry, like steps of FIG. 5 and FIG. 6 and of FIG. 10, FIG. 11 and FIG. 12 being designated by like reference characters.

In accordance with FIG. 10, following release of a start signal by the starting step 72, the variables required for measuring and determining the unknown test light frequency $f_x$ are stored in the electronic double control 95 in a storage step 107. In addition to starting frequency $f_{LO1}$ of the microwave transmitter 13, the sideband altering frequency $\Delta f_{LO}$ of the frequency comb of the frequency generator 1, the reference frequency $f_{ref}$ of the reference light source 8, the centering tolerance frequency $\Delta f_{ZF}$ as well as the minimum level $U_S$, there are also stored a displacement frequency limit value $\Delta\Delta_A$, a displacement frequency tolerance value $\Delta\Delta_X$, a comb light tolerance value $\Delta\Delta_X$ as well as a comb light step value $\Delta f_r$. A test light intermediate frequency limit value $f_{g1}$ which corresponds to the limit frequency of the test light intermediate frequency filter 105, is stored as an additional variable.

In an ensuing switch set step 108, the test light intermediate frequency filter 105 of the beat intermediate frequency double filters 102, 103 is connected and the light input selection switch 98 is actuated for superheterodyning the test light with the light output of the comb generator 1. The transmission frequency $f_{LO}$ of the microwave transmitter 13 is adjusted to the starting frequency $f_{LO1}$ and a value minus 1 is stored in a step counter I, in a following initializing step 109.

In a following comb light frequency reduction step 110 the center frequency $f_r$ of the comb light generator 1 is reduced by twice the value of the test light intermediate frequency limit value $f_{g1}$. In a following step counter test step 11 a determination is made whether the value of the step counter is greater than the starting frequency $f_{LO1}$ of the microwave transmitter 13 divided by twice the value of the test light intermediate frequency limit value $f_{g1}$. If the condition is met, the measurement will be terminated with stopping step 77.

If the test condition of the step counter test step 111 is not met, a determination is made in the ensuing signal test step 78 whether at least either the TE signal level $U_{TE}$ of the first output meter 66, for instance, or the TM signal level $U_{TM}$ of the second output meter 71 is greater than the minimum level $U_S$.

If neither the TE signal level $U_{TE}$ nor the TM signal level $U_{TM}$ exceeds the minimum level $U_S$, the step counter I value is increased by 1 in a step counter increase step 112, and thereafter another comb light frequency reduction step 110 is executed.

If at least one of the signal levels $U_{TE}$, $U_{TM}$ is greater than the minimum level $U_S$, the process continues in accordance with the algorithm of FIG. 5 and FIG. 6 by executing either the TE switching step 80 or the TM switching step 81, depending upon the relative value of the signal levels $U_{TE}$, $U_{TM}$, and in the first intermediate frequency test step 82 the intermediate frequency $f_{ZF}$ is stored as a first intermediate frequency test value $f_{ZFA}$. Thereafter, in a comb light frequency reduction step 113, the center frequency $f_r$ is reduced by the first intermediate frequency value $f_{ZFA}$. The intermediate frequency $F_{ZF}$ is then stored as a second intermediate frequency test value $f_{ZFB}$, by the second intermediate frequency test step 84. In accordance with FIG. 11, it is determined by the ensuing intermediate frequency comparison step 85 whether the second intermediate frequency test value $f_{ZFB}$ is smaller than the centering tolerance frequency $\Delta f_{ZF}$.

If the condition is not met, the center frequency $f_r$ is, by a comb light frequency increase step 114, increased by twice the value of the first intermediate frequency test value $f_{ZFA}$. This ensures that the sideband frequency $f_N$ which generates the intermediate frequency $f_{ZF}$ is approximately equal to the unknown test light frequency $f_x$.

In a comb light frequency reduction step 115 the center frequency $f_r$ is thereafter decreased by a comb light frequency reduction step 115 by half the value of the test light intermediate frequency limit value $f_{g1}$, and in a switch setting step 116 the reference light intermediate frequency filter 106 of the beat intermediate frequency double filters 102, 103 is connected by means of a switching signal in the light selector switching conduit 97, and the light input selector switch 98 is switched to feed the light output of the reference light source 8 to the first mode splitter 49. Thereafter, an intermediate frequency sign variable $v_1$ is set to the value plus 1 in an intermediate frequency sign setting step 117.

In an ensuing displacement frequency determination step 118 the displacement frequency $\Delta$ between the reference frequency $f_{ref}$ and a frequency component of the light output of the comb generator 1 may be stored as a displacement frequency test value $\Delta_A$. In an ensuing range test step 119 it is determined whether the displacement frequency test value $\Delta_A$ lies between the displacement frequency limit value $\Delta\Delta_A$ and the sum of half the difference between the transmission frequency $f_{LO}$ of the microwave transmitter 13 as well as the test light intermediate frequency limit value $f_{g1}$ plus the displacement frequency tolerance value $\Delta\Delta_B$.

If the displacement frequency test value $\Delta_A$ does not lie within this range, the center frequency $f_r$ is increased by the test light intermediate frequency limit value $f_{g1}$ in a comb light frequency increase step 120, and in an intermediate frequency sign setting step 121 the intermediate frequency sign variable $v_1$ is set to the value minus 1. Thereafter, the process is continued by a further displacement frequency determination step 118.

If the displacement frequency test value $\Delta_A$ lies within the range tested by the range testing step 119, the center frequency $f_r$ is changed by the comb light step value $\Delta f_r$ by a comb light frequency stepping step 122, and in an ensuing displacement frequency measuring step 123 the displacement frequency $\Delta$ is measured precisely as a displacement frequency measurement value $\Delta_x$ in the frequency meter 22.

Following the displacement frequency measuring step 123 a determination is made by a displacement frequency comparison step 124 whether the measured displacement frequency value $\Delta_x$ is greater than the displacement frequency test value $\Delta_A$. If the condition is true a displacement frequency sign variable $v_2$ is assigned the value plus 1 in a displacement frequency setting step 125. If the condition of the displacement frequency comparison step 124 is not true, the comparison frequency sign variable $v_2$ is set to minus 1 in another displacement frequency sign setting step 126.

In accordance with FIG. 12, in a switch setting step 127 the test light is fed to the first mode splitter 49 and the test light intermediate frequency filter 105 is connected by a switching signal in the light selector switching conduit 97. The intermediate frequency $f_{ZF}$ resulting from the superheterodyning of the test light with the light output of the comb generator 1 is now measured with great precision and is stored as a first intermediate frequency measured value $f_{ZF1}$. Thereafter, the reference light intermediate frequency filter 106 is connected by a switching signal in the light selector switching conduit 97 in a switch setting step 128, and the light output of the reference light source is fed to the first mode splitter 49. In the ensuing transmission frequency altering step 89, the starting frequency $f_{LO1}$ alters the transmission frequency $f_{LO}$ of the microwave transmitter 13 by the sideband altering frequency $\Delta f_{LO}$.

In a further displacement frequency determination step 129 the displacement frequency $\Delta$ will thereafter be measured and stored as a displacement frequency test value $\Delta_A$. In a following tolerance test step 130 it will be determined if the quantitative difference between the displacement frequency measurement value $\Delta_x$ and the displacement frequency test value $\Delta\Delta_x$ measured by a further displacement frequency determination step 129 is smaller than the comb light tolerance value $\Delta\Delta_x$.

If the condition of the tolerance test step 130 is not met, the center frequency of the light output of the comb generator 1 is reduced by a comb light frequency altering step 131 by the difference between the displacement frequency test value $\Delta_A$ and the displacement frequency measurement value $\Delta_x$ multiplied by the value of the displacement frequency sign variable $v_2$. Thereafter, the process is continued by a further displacement frequency determination step 129.

If the condition of the tolerance test step 130 is met, the test light may be fed to the first mode splitter 49 and the test light intermediate frequency filter 105 may be connected by a switching signal from the light selector switching conduit 97. This is followed by the intermediate frequency determination step 90 by which the intermediate frequency $f_{ZF}$ is determined which results from superheterodyning the test light with the light output of the comb generator 1, and stored as a second intermediate frequency measurement value $f_{ZF2}$. The number and sign of sidebands N can then be defined by sideband defining step 133 by means of the actual intermediate frequency sign variables $v_1$, the sideband altering frequency $f_{LO}$, as well as the stored intermediate frequency measurement values $f_{ZF1}$, $f_{ZF2}$, on the basis of the following equation:

$$N := v_1 \cdot \mathrm{sign}[\Delta f_{LO}(f_{ZF1} - f_{ZF2})] \cdot \mathrm{rnd}|(f_{ZF2} - f_{ZF1})/\Delta f_{LO},$$

where "sign" is a sign defining function and "rnd" is a whole integer rounding-off function.

In a test light frequency calculation step 134 the unknown test light frequency $f_X$ may now be determined with absolute certainty as the sum of the reference frequency $f_{ref}$, the displacement frequency measurement value $\Delta_X$ multiplied by the displacement frequency sign variable $v_2$, the starting frequency $f_{LO1}$ multiplied by the number N of sidebands and of the first intermediate frequency measurement value $f_{ZF1}$ multiplied by the intermediate frequency sign variable $v_1$, in accordance with the following expression:

$$f_x := f_{ref} + v_2 \cdot \Delta_X + N \cdot f_{LO1} + v_1 \cdot f_{ZF1}.$$

The measurement terminates with an indication of the test light frequency $f_x$ in the frequency indicator device 25.

The last-mentioned embodiment is particularly suitable in applications where the center frequency control 6 of the embodiment of FIG. 6 has to be designed for a very broad banded operation and where very high frequencies are to be controlled with great precision. These requirements the realization of which is technically very complex have been avoided in the last-mentioned embodiment by measuring displacement frequencies Δ, which while resulting in longer measuring times significantly simplify the construction of the optical frequency generator for use in determining unknown optical frequencies.

What is claimed is:

1. An optical frequency generator, comprising:
   a reference light source;
   an optical comb generator for generating a plurality of optical frequencies including a center frequency and comprising a frequency modulated light source and an optical non-linear component for receiving output light from the frequency modulated light source;
   means for combining the output of the reference light source and of the optical comb generator for generating a control signal for modulating the frequency of the frequency modulated light source;
   a frequency transmitter for generating an output signal for modulating the frequency of the frequency modulated light source;
   an electronic control for setting the frequency of the frequency transmitter;
   whereby the frequency modulated light source and the optical non-linear component generate a plurality of side bands relative to the center frequency, the frequency of the side bands being a multiple of the frequency of the output signal from the frequency transmitter.

2. The optical frequency generator of claim 1, wherein the frequency modulated light source comprises a mode-coupled semiconductor laser.

3. The optical frequency generator of claim 2, wherein the semiconductor laser comprises an external resonator.

4. The optical frequency generator of claim 3, wherein the semiconductor laser further comprises means for generating a control current and the output of the frequency transmitter is superimposed on the control current.

5. The optical frequency generator of claim 4, wherein the control current of the semiconductor laser comprises a portion correlated with the control signal.

6. The optical frequency generator of claim 5, wherein the external resonator comprises a reflection grating for controlling the center frequency.

7. The optical frequency generator of claim 6, wherein the optical non-linear component comprises a light amplifier receiving light from the frequency modulated light source.

8. The optical frequency generator of claim 7, wherein the optical non-linear component further comprises a light guide fiber receiving light from the light amplifier.

9. The optical frequency generator of claim 8, wherein the minimum dispersion of the light guide fiber substantially corresponds to the center frequency of the frequency modulated light source.

10. The optical frequency generator of claim 9, wherein the means for combining the output of the reference light source and of the optical comb generator comprises at least one light sensitive detector for receiving light from the comb generator and from the reference light source.

11. The optical frequency generator of claim 10, wherein the means for combining the output of the reference light source and of the optical comb generator further comprises a frequency filter and has a band width not exceeding the largest difference between the frequency of the light from the reference light source and the light from the comb generator.

12. The optical frequency generator of claim 11, wherein the means for combining the output of the reference light source and of the optical comb generator further comprises a comparator the output signal of which in response to a deviation between a beat frequency detected by the light-sensitive detector and a difference frequency fed to the comparator by a difference frequency generator controlled by the electronic control is correlated to the control signal.

13. The optical frequency generator of claim 11, wherein a beat frequency signal generated on the light sensitive detector by combining the output of the reference light source and of the optical comb generator is fed to the electronic control for generating a further control signal for controlling the reference light source.

14. The optical frequency generator of claim 11, further comprising a source of test light of unknown frequency and a heterodyne receiver and wherein the output of the source of test light of unknown frequency and the output of the frequency generator are heterodyned in the heterodyne receiver at a bandwidth not exceeding half of the smallest transmission frequency, the output signal of the heterodyne receiver being correlated as a beat frequency to a frequency difference between the output of the frequency generator and the output of the test light source.

15. The optical frequency generator of claim 14, further comprising a frequency counter connected to an output of the heterodyne receiver for defining the frequency of the beat frequency and for feeding the defined beat frequency to the electronic control.

16. The optical frequency generator of claim 15, wherein the electronic control is adapted to define the frequency of the test light on the basis of the frequency of the output of the reference light source, the transmission frequency of the frequency generator and the difference between the frequency of the output of the reference light source and a component of the frequency of the output of the comb generator.

* * * * *